US009378786B2

(12) United States Patent
Shaeffer et al.

(10) Patent No.: US 9,378,786 B2
(45) Date of Patent: Jun. 28, 2016

(54) MEMORY CONTROLLER WITH PHASE ADJUSTED CLOCK FOR PERFORMING MEMORY OPERATIONS

(75) Inventors: Ian P. Shaeffer, Los Gatos, CA (US); Lei Luo, Durham, NC (US)

(73) Assignee: Rambus Inc., Sunnyvale, CA (US)

( * ) Notice: Subject to any disclaimer, the term of this patent is extended or adjusted under 35 U.S.C. 154(b) by 253 days.

(21) Appl. No.: 14/111,857

(22) PCT Filed: Apr. 18, 2012

(86) PCT No.: PCT/US2012/034021
§ 371 (c)(1),
(2), (4) Date: May 14, 2014

(87) PCT Pub. No.: WO2012/145360
PCT Pub. Date: Oct. 26, 2012

(65) Prior Publication Data
US 2014/0281205 A1 Sep. 18, 2014

Related U.S. Application Data

(60) Provisional application No. 61/476,594, filed on Apr. 18, 2011.

(51) Int. Cl.
G06F 13/12 (2006.01)
G06F 13/00 (2006.01)
G11C 7/10 (2006.01)
G06F 13/42 (2006.01)

(52) U.S. Cl.
CPC .......... *G11C 7/1072* (2013.01); *G06F 13/4243* (2013.01)

(58) Field of Classification Search
CPC ........... G11C 7/1072; G11C 7/22; G11C 7/10
See application file for complete search history.

(56) References Cited

U.S. PATENT DOCUMENTS

| 6,075,393 | A  | * | 6/2000 | Tomita ............... G11C 7/1078 327/153 |
| 6,128,749 | A  | * | 10/2000 | McDonnell ............... G06F 5/06 710/58 |
| 6,401,167 | B1 |   | 6/2002 | Barth et al. |
| 7,391,255 | B2 | * | 6/2008 | Matsuzaki ............... G06F 1/10 327/141 |
| 7,795,941 | B2 | * | 9/2010 | Takahashi ............... H03K 5/05 327/261 |
| 2002/0056021 | A1 |   | 5/2002 | Manning |
| 2004/0001349 | A1 | * | 1/2004 | Perego ............... G11C 7/1051 365/63 |
| 2004/0153602 | A1 | * | 8/2004 | Lovett ............... G06F 13/1689 711/106 |
| 2007/0091708 | A1 | * | 4/2007 | Ishimoto ............... G11C 7/1051 365/230.05 |
| 2008/0175070 | A1 |   | 7/2008 | Perego |
| 2009/0019184 | A1 |   | 1/2009 | Skerlj et al. |
| 2010/0138598 | A1 |   | 6/2010 | LaBerge |
| 2011/0246713 | A1 | * | 10/2011 | Bains ............... G11C 7/22 711/106 |

OTHER PUBLICATIONS

ISR for PCT/US2012/034021, Jan. 17, 2013.
PCT International Preliminary Report on Patentability dated Oct. 31, 2013 (Chapter I) in International Application No. Pot/US2012/034021. 6 pages.
Pot International Search Report and Written Opinion dated Nov. 12, 2012 in International Application No. PCT/US2012/034021, 9 pages.
* cited by examiner

*Primary Examiner* — Jing-Yih Shyu
(74) *Attorney, Agent, or Firm* — Fenwick & West LLP

(57) ABSTRACT

In an illustrative embodiment, the memory circuit includes first and second data paths on which data is transferred for read and write memory operations and first and second mixer circuits for adjusting the phase of clock signals applied to their inputs. The mixer circuits are cross-coupled so that the outputs of the first and second mixers are both available to both the first and second data paths. One mixer is used to provide a first phase adjusted clock signal for use by the operating circuit and the other mixer is used to provide a second phase adjusted clock signal for use by a following operation whatever that may be.

16 Claims, 5 Drawing Sheets

MEMORY CONTROLLER WITH PHASE ADJUSTED CLOCK FOR PERFORMING MEMORY OPERATIONS

BACKGROUND

This relates to reducing delays arising from switching in electrical circuits. It is particularly useful in memory circuits and will be described in that context. However, it may also find application elsewhere.

It frequently is necessary to switch the circuits that are used to access the memory of a computer. For example, it is necessary to switch between the circuits that are used to write data into the memory and those that are used to read data from the memory. Often these circuits are also time-shared between different memories, which are commonly referred to as different ranks of memories. Such time-sharing also requires switching between the different ranks of memories.

When an electrical circuit is being switched, it becomes temporarily unusable for accurate signal transmission. Thus, there is a delay between the last valid data processed by the electrical circuit before switching and the first valid data after switching. This delay is commonly referred to as a bubble; and when the delay is on a bidirectional data bus, it is commonly referred to as a DQ bubble. Due to the demand for faster memory operations, there is a need to eliminate or reduce the size of the DQ bubbles.

BRIEF DESCRIPTION OF THE DRAWINGS

These and other objects and advantages of the present invention will be apparent to those of ordinary skill in the art in view of the following detailed description in which.

DETAILED DESCRIPTION

In embodiments of the present disclosure, a memory system includes a memory controller and one or more memory devices. The memory controller and each of the memory devices include memory interface circuits that are controlled by one or more clock signals such that data bits are read or written on the rising or falling edges of the clock signal(s). Advantageously, the read or write takes place near the midpoints of the data bits. Because of various timing delays in the data signal, it is often necessary to adjust the phase(s) of the clock signal(s) so that the rising or falling edges of the clock signal(s) occur near the mid-points of the data signal bits. In one embodiment, the phase of a clock signal is adjusted by a phase delay circuit, which includes one or more mixers.

In embodiments of the present disclosure, a memory interface circuit includes first and second data paths on which data is transferred for read and write memory operations, respectively. The memory interface circuit further includes first and second mixer circuits for adjusting the phases of clock signals applied to clock inputs of the first and second data paths. The mixer circuits are cross-coupled to the first and second data paths so that the output of each of the first and second mixers is available to both the first and second data paths. In this situation, one mixer is used to provide a first phase adjusted clock signal for use by one of the data paths during a current operation and the other mixer is used to provide a second phase adjusted clock signal for use by either the same one or a different one of the data paths during a following operation. Each of the current operation and the following operation can be a read operation or a write operation.

Figure 1:
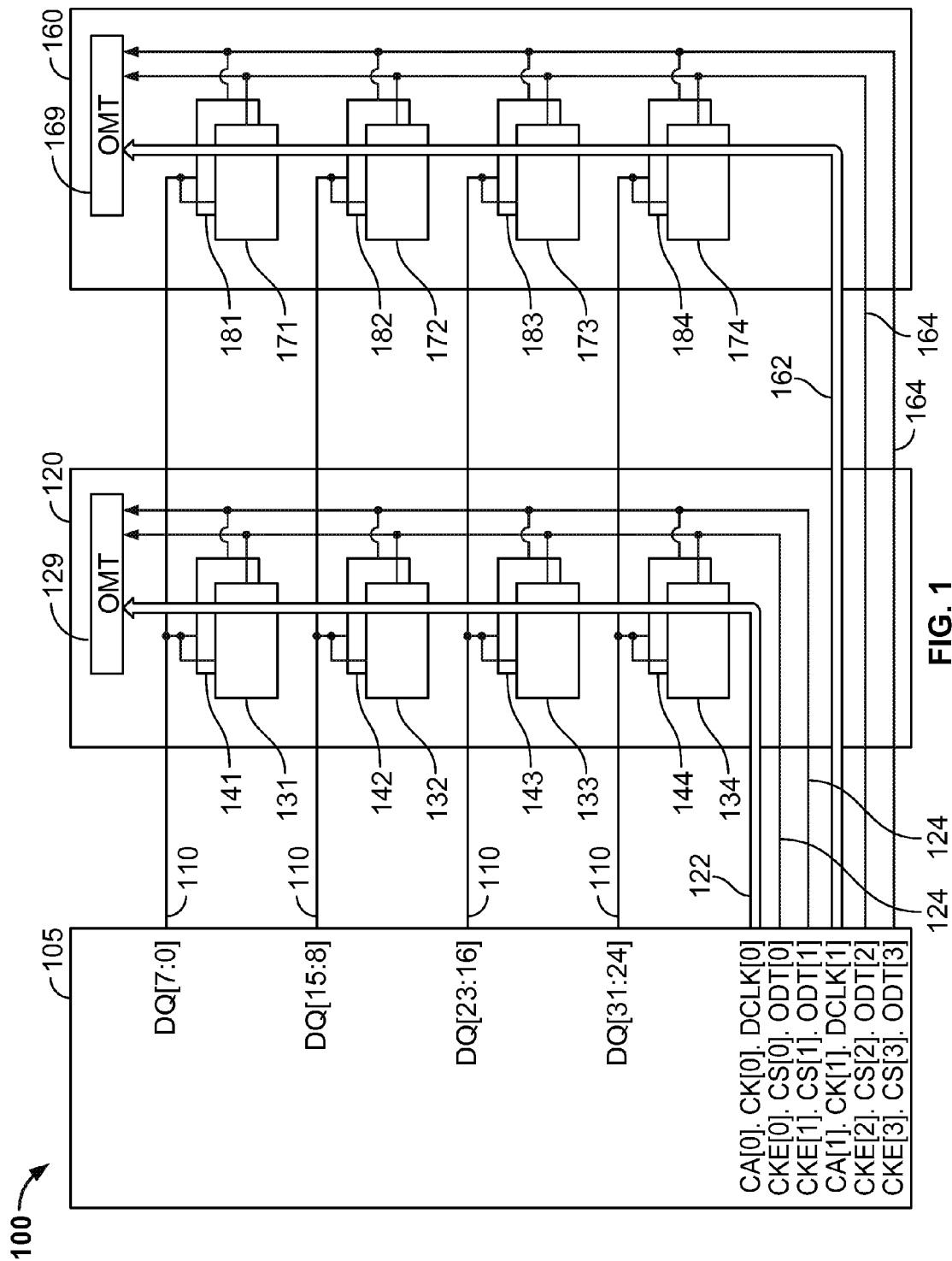
FIG. 1 is a block diagram of an illustrative embodiment of a memory controller and memory modules.

FIG. 1 is a block diagram of an illustrative embodiment of a memory system 100. Memory system 100 includes a memory controller 105 and one or more memory modules, such as memory modules 120, 160. The memory system can be used in a digital processing system, such as a computer (not shown). Mounted on the memory modules are memory devices 131-134, 141-144, 171-174 and 181-184. In one embodiment, the memory devices are dynamic random access memory (DRAM) integrated circuits. Alternatively, the memory devices can be flash memory (NAND or NOR), RRAM, CB-RAM, MRAM, or other memory technology types. Illustratively, the memory devices are organized in groups of four, known as ranks, where a first rank includes memory devices 131-134; a second rank includes memory devices 141-144; a third rank includes memory devices 171-174; and a fourth rank includes memory devices 181-184.

A bidirectional data bus 110 connects the memory controller 105 to the four ranks of memory devices. The bus 110 can be, for example, 32 bits wide, so that it includes 32 parallel lines. The first eight lines of the data bus are connected to the first memory device in each of the four ranks; the second eight lines are connected to the second memory device in each rank; and so on. A first address bus 122 and various control signal lines 124 connect the memory controller to the memory devices on the first memory module and terminate in an on module termination (OMT) 129; and a second address bus 162 and various control signal lines 164 connect the memory controller to the memory devices on the second memory module. Bus 162 and lines 164 terminate in OMT 169. Each address bus supplies row and column addresses for the memory cells in the memory devices. The control signals include command signals for read and write operations as well as signals that time share the memory controller and data bus with the four ranks of memory devices by selecting which rank of memory devices is to operate with the data bus 110. These signals include clock enable (CKE), chip select (CS) and on-die termination (ODT) signals.

Figure 2:
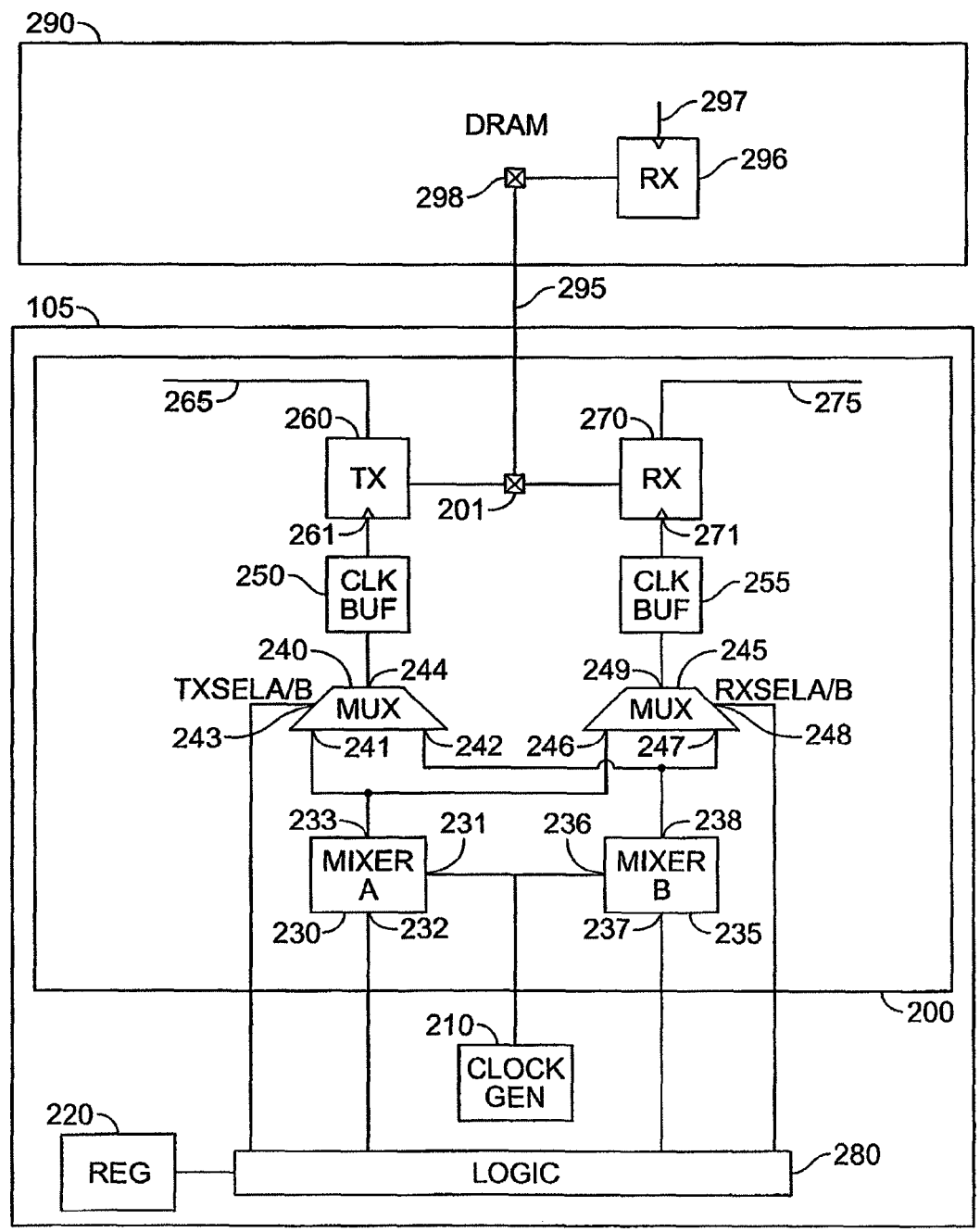
FIG. 2 is a block diagram of an illustrative embodiment of the invention.

In one embodiment, the memory controller 105 includes a plurality of memory interface circuits each coupled to a respective one of the lines in the data bus 110. FIG. 2 illustrates the memory controller 105 where one of such memory interface circuits 200 is shown. Memory interface circuit 200 comprises a terminal or pad 201 for coupling to a line 295 of the data bus 110, a write data path including a write circuit 260 having a data output coupled to the pad 201 and one or more data inputs coupled to one or more write data lines 265, and a read data path including a read circuit 270 having a data input coupled to the pad 201 and one or more data outputs coupled to one or more read data lines 275. Memory interface circuit 200 further comprises first and second mixers 230, 235, first and second multiplexers 240, 245, and first and second buffers 250, 255.

The memory controller 105 further includes a clock signal generator 210, a settings register 220, and control logic 280. In one embodiment, clock signal generator 210 and control logic 280 are shared among at least some of the plurality of memory interface circuits. Also shown in FIG. 2 is one of the memory devices 290 to which line 295 of the bidirectional data bus 110 is coupled at a terminal or pad 298.

Mixers 230, 235 are phase adjustment circuits that receive the clock signals from the clock signal generator 210 at first clock inputs 231, 236, respectively, and index values at second inputs 232, 237, respectively, and adjust the phase of the clock signals by amounts specified by the index values.

The index values are stored in settings register 220 and supplied to mixers 230, 235 by control logic 280. By way of example but not limitation, each index value may specify that the phase of the clock signal received at the clock input be delayed by some integer multiple of a predetermined phase angle such as 1.4 degrees (1.4°≈360°/256). The amount of the delay is such that when the phase delayed clock signal is used to clock the transmission of a data signal in write circuit 260 or the reception of a data signal in read circuit 270, the rising and/or falling edges of the clock signal are at the appropriate point that a write or a read occurs near the mid-points of the data bits in the data signal. This amount of delay is either derived from prior read and/or write memory operations or estimated based on known information. The appropriate index values for each read and write memory operation are loaded into settings register 220 by the computer; and the index values are accessed therefrom by control logic 280 in the order in which they are used.

The phase adjusted signals are output from the mixers at outputs 233, 238, respectively, and supplied to inputs 241, 242 to multiplexer 240 and inputs 246, 247 to multiplexer 245. Multiplexers 240, 245 select a signal supplied to one of their inputs in accordance with a selection signal supplied by control logic 280 to control inputs 243, 248, respectively, and provide the selected signal to their outputs 244, 249, respectively. As a result, the phase adjusted signals at the outputs of both mixers 230, 235 are cross-coupled and can be supplied at the output of either multiplexer 240, 245.

The outputs from multiplexers 240, 245 are buffered by clock buffers 250,255 and provided to clock inputs 261, 271 of write circuit 260 and read circuit 270, respectively. Write circuit 260 is configured to transmit write data received from internal circuits of the memory controller 100 via the one or more data lines 265 to the bidirectional data line 295 in response to the clock signal at its clock input 261; and read circuit 270 is configured to receive read data from the bidirectional data line 295 in response to the clock signal at its clock input 271 and transfer the read data via the one or more read data lines 275 to internal circuits of the memory controller 105 for further processing.

As indicated above, data bits are typically read on the rising or falling edge of a read clock signal; and such reading is best done near the mid-point of the data bit. Data bits are typically written to an output line on the rising or falling edge of a write clock signal; and such writing is best done to make sure that the signal bits at a signal input of a receiver circuit 296 in DRAM 290 are center aligned with a read clock signal at clock input 297 of receiver circuit 296. By using the appropriate phase adjustment in the clock signal applied to the clock input of write circuit 260 or read circuit 270, the rising or falling edge of the clock signal at read clock input 271 in the case of a read operation and the rising or falling edge of the clock signal at read clock input 297 in the case of a write operation occurs near the mid-point of the data bits in the signal on the data path at the inputs to read circuit 270 and receiver circuit 296, respectively.

Control logic 280 controls the sequencing of reading of index values from settings register 220 and the selection of output signals by multiplexers 240, 245 for application to write and read circuits 260, 270. The control logic may be implemented in dedicated circuitry or may be a program run by a processor (not shown) coupled to the memory controller 105.

Figure 3:
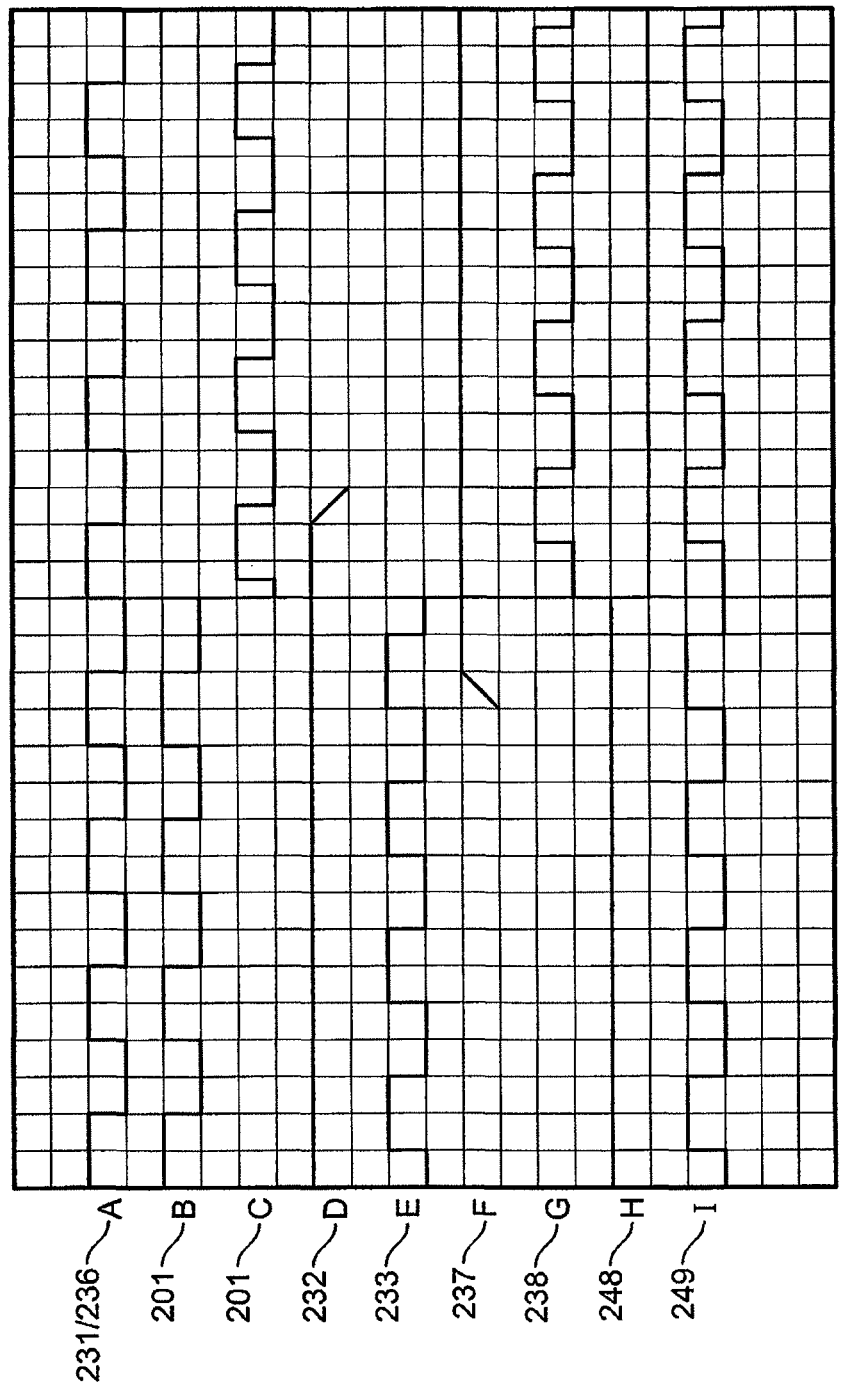
FIG. 3 is a timing diagram depicting certain operations of the embodiment of FIG. 2.

FIG. 3 is a set of timing diagrams illustrating the operation of the circuitry of FIG. 2 during first and second read operations performed on different ranks of memory devices. To simplify the illustration, it is assumed that the only phase delays in memory interface circuit 200 are in the data lines and in mixers 230, 235. Further it is assumed that the second of the two data signals is delayed 45 degrees relative to the first data signal and that two index values are stored in settings register 220 appropriate for generating phase delays in two clock signals such that the rising and falling edges of the two phase adjusted clock signals are near the mid-points of the data bits in the two data signals.

Signal A depicts the clock signal at the output of clock signal generator 210 and at the inputs 231, 236 to mixers 230, 235. Signal B depicts a first data signal from the first rank of memory devices at data input 201 to read circuit 270; and signal C depicts a second data signal from the second rank of memory devices at data input 201 to read circuit 270.

Signal D depicts the index value at second input 232 to mixer 230; signal E depicts the phase adjusted clock signal at the output 233 of mixer 230; signal F depicts the index value at second input 237 to mixer 235; signal G depicts the phase adjusted clock signal at the output 238 of mixer 235; signal H depicts the selection signal at control input 248 of multiplexer 245; and signal I depicts the phase-adjusted clock signal at both the output 249 of multiplexer 245 and the clock input 271 of read circuit 270.

To adjust the phase of the clock signals applied to read circuit 270 so that their rising or falling edges occur near the mid-points of the first and second data signals received at read circuit 270 from the first and second ranks of memory devices, the first index value (signal D) is provided to the second input 232 of mixer 230; and the second index value (signal F) is provided to the second input 237 of mixer 235. At mixer 230, the clock signal is phase-adjusted based on the first index value and is output as the first phase adjusted clock signal (signal E). Since this is a read operation, multiplexer 245 is controlled by selection signal H to select the signal from mixer 230 as its output. Accordingly, during the first read operation, the output signal from multiplexer 245 and the clock signal provided to read circuit 270 are as shown by signal I with the phase determined by the first index value. As will be apparent, the rising and falling edges of the first phase adjusted clock signal (signal I) are near the mid-points of the first data signal (signal B).

For the second read operation, mixer 235 adjusts the phase of the clock signal based on the second index value and outputs the second phase adjusted clock signal as signal G. When the time comes to switch operations from the first rank to the second rank to perform the second read operation, multiplexer 245 is controlled by selection signal H to select the signal from mixer 235 as its output. Again, the output signal from multiplexer 245 and the clock signal provided to read circuit 270 are as shown by signal I; but the phase of the clock signal is determined by the second index value so that the rising and falling edges of the second phase adjusted clock signal are near the mid-points of the data bits in the second data signal (signal C). Meanwhile, the first index value can be terminated since it is no longer used. Since the second phase adjusted clock signal was already operating when operations were switched from the first rank to the second rank of memory devices, there is very little delay between the time valid data was last available on data bus 295 during the first read operation and the time valid data is first available on the data bus during the second read operation. In particular, the amount of delay in this circumstance is reduced by a factor of almost ten compared to a circuit that does not use cross-coupled mixers as described above.

To prepare for the next operation, a third index value is provided to the second input 232 of mixer 230 after the first read operation terminates. The phase of a third clock signal is adjusted by the amount specified by the third index value; and the process continues with the generation of the phase-adjusted clock signals alternating between mixer 230 and mixer 235.

Figure 4:
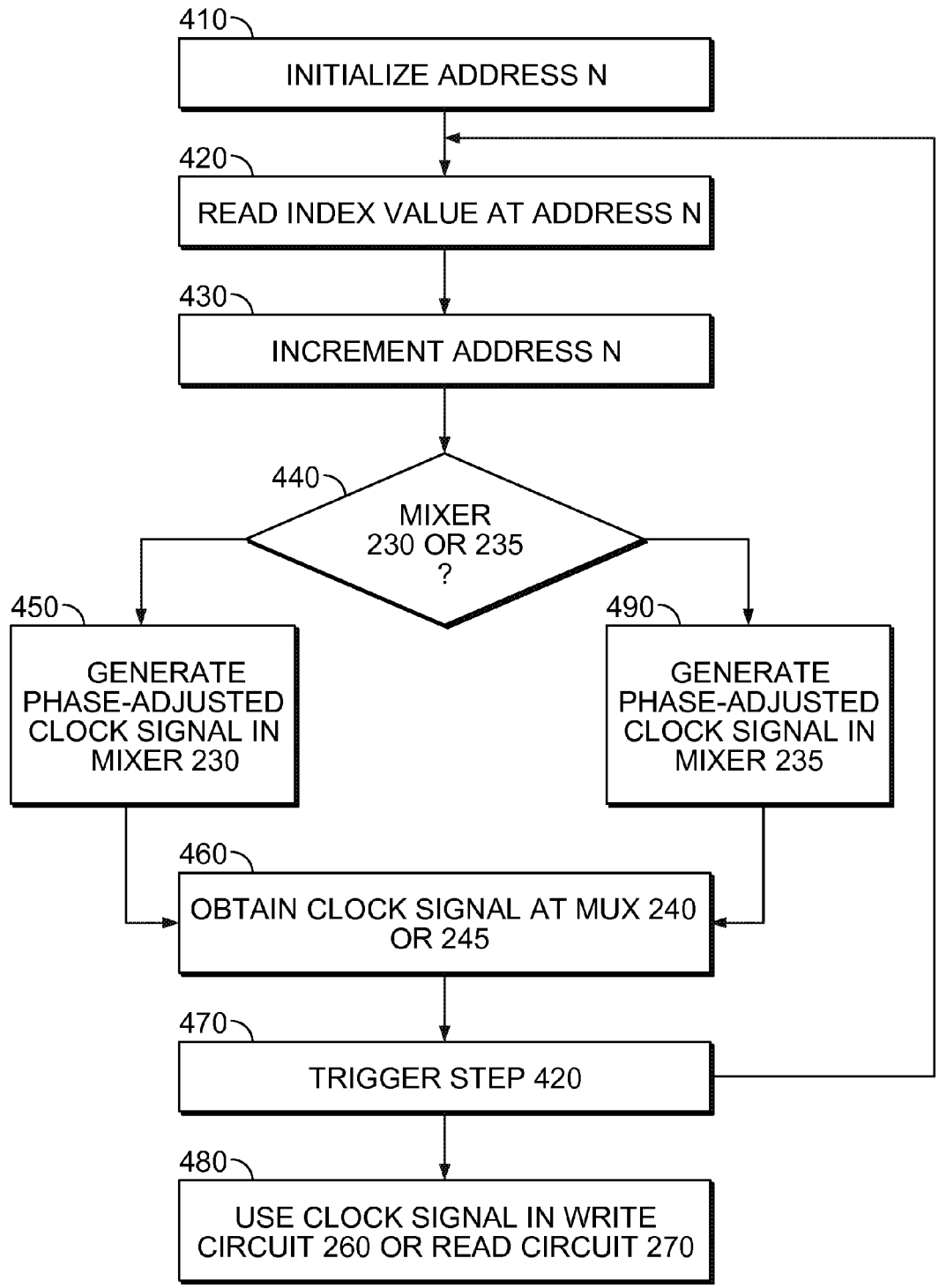
FIG. 4 is a flowchart of an illustrative embodiment of the invention.

FIG. 4 is a flowchart summarizing this operation of the embodiment of FIG. 2. The flowchart begins at step 410 with initialization of a register address n. Illustratively, n is set equal to zero. At step 420, address n is used to read from settings register 220 the index value stored at address n; and at step 430, address n is incremented. At step 440, a determination is made as to which mixer 230, 235 to use to generate the next phase-adjusted clock signal. This determination can be made by tracking which mixer is presently being used to generate the phase-adjusted clock signal and simply using the other mixer to generate the next phase-adjusted clock signal. At step 450, the index value that was read at step 420 is provided to the second input of the inactive mixer; and that mixer begins to generate a clock signal that is phase-adjusted by an amount specified by the index value. At step 460, this clock signal is obtained by either multiplexer 240 or 245 using a selection signal applied to control input 243 or 248. At step 470, step 420 is triggered to read the next index value stored at the address value n that was obtained at step 430. And at step 480, the clock signal obtained at step 460 is used in write circuit 260 or read circuit 270. The process then repeats itself using the next index value and the other mixer to generate another phase-adjusted clock signal at step 490. And so on. As will be apparent from the foregoing description, this process can continue for as long as desired with the multiplexers switching back and forth between the two mixers, using the phase adjusted clock signal from one mixer for the current read or write operation and the phase adjusted clock signal from the other mixer for the next read or write operation. Successive operations can be performed on the same rank of memory or on different ranks of memory.

Figure 5:
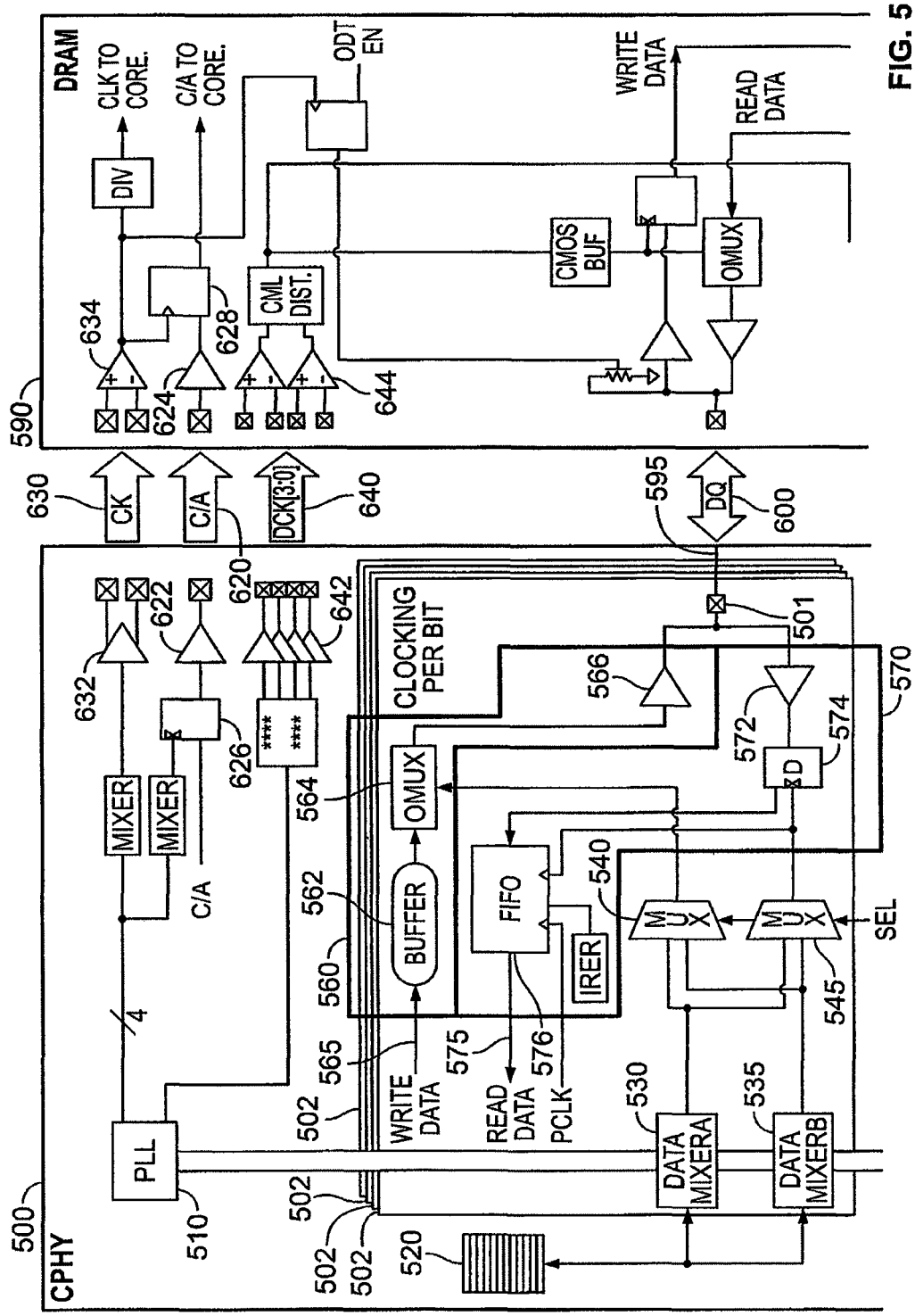
FIG. 5 is a more detailed block diagram of a second illustrative embodiment of the invention.

FIG. 5 depicts a second illustrative embodiment of the invention. Circuit 500 comprises a plurality of memory interface circuits 502, each coupled to a respective one of the lines of a bidirectional data bus 600. Each memory interface circuit comprises a terminal or pad 501 for coupling to a line 595 of data bus 600, a write data path including a write circuit 560 having a data output coupled to the pad 501 and one or more data inputs coupled to one or more write data lines 565, and a read data path including a read circuit 570 having a data input coupled to the pad 501 and one or more data outputs coupled to one or more read data lines 575. Write circuit 560 includes a levelization buffer 562 for adjusting the timing of the data bits of the write signal in full bit-time increments accounting for long flight time delay variations across multiple DRAMS in a system, an output multiplexer 564 and a signal driver 566. Read circuit 570 includes a signal driver 572, a D-type flip-flop 574 and a levelization FIFO 576 for adjusting the timing of the data bits in the read signal in full bit-time increments similar to the write levelization buffer 562.

Circuit 500 further comprises a phase lock loop (PLL) 510 for generating clock signals, a settings register 520, first and second mixers 530, 535, and first and second multiplexers 540, 545. The PLL is shared among all the memory interface circuits 502.

The operation of these elements of FIG. 5 is essentially the same as the operation of the corresponding elements of FIG. 2 with the clock signals from the output of multiplexer 540 being applied to the clock input of output multiplexer 564 to clock the write data signal; and the clock signals from the output of multiplexer 545 being applied to the clock inputs of D-type flip-flop 574 and levelization FIFO 576 to clock the read data signal.

FIG. 5 also depicts a memory 590, a bidirectional data bus 600, and assorted control and addressing circuitry. The memory modules 120, 160 and bidirectional data bus 110 of FIG. 1 are illustrative of memory 590 and data bus 600 of FIG. 5 The control and addressing circuitry includes an address bus 620 with drivers 622, 624 and clocking circuitry 626, 628; and clocking buses 630, 640 with drivers 632, 634, 642, 644 and assorted clocking circuitry.

Numerous variations may be practiced in the embodiments described above. For example, multiplexers 240, 245 could have an additional control input that determines whether they produce an output or not. In other embodiments, it may be useful to have more than two mixers so as to have available more than two different phase-adjusted clock signals.

As will be apparent to those skilled in the art, still other variations may be practiced within the spirit and scope of the present invention.

What is claimed is:

1. Apparatus comprising:
   a pad for coupling the apparatus to a bidirectional data bus supporting data transfer with one or more memory devices separate from the apparatus;
   a read data path on which data is transferred for read memory operations with the one or more memory devices via the pad;
   a write data path on which data is transferred for write memory operations with the one or more memory devices via the pad;
   a first phase adjustment circuit having at least one first clock input to receive at least one clock signal and at least one first clock output to output a first phase adjusted clock signal;
   a second phase adjustment circuit having at least one second clock input to receive at least one clock signal and at least one second clock output to output a second phase adjusted clock signal; and
   a cross coupler to selectively couple one of the first clock output and the second clock output to either the read data path or the write data path during a first memory operation and to selectively couple the other of the first clock output and the second clock output to either the read data path or the write data path during a second memory operation following the first memory operation.

2. The apparatus of claim 1 wherein the cross coupler includes at least one multiplexer each having inputs coupled to the first and second clock outputs.

3. The apparatus of claim 1 further comprising a clock signal generator for supplying at least one clock signal to each phase adjustment circuit.

4. The apparatus of claim 1 wherein the apparatus is a memory controller for controlling memory devices organized in different ranks.

5. The apparatus of claim 1 wherein the cross coupler selectively couples the first clock output and the second clock output to the read data path and the write data path, respectively, during a first memory operation and coupling the first clock output and the second clock output to the write data path and the read data path, respectively, during a second memory operation following the first memory operation.

6. A memory controller for controlling memory devices organized in ranks, including a first rank and a second rank, the memory controller comprising:
- a receiver circuit to receive read data from the memory devices, wherein the receiver circuit receives read data from the first rank via a pad and receives read data from the second rank via the pad;
- a first phase adjustment circuit for adjusting a phase of a clock signal to produce a first phase adjusted clock signal;
- a second phase adjustment circuit for adjusting a phase of a clock signal to produce a second phase adjusted clock signal; and
- wherein, during two consecutive first and second read operations involving first and second ranks, respectively, the memory controller is configured to couple the first phase adjusted clock signal to the receiver circuit during the first read operation and to couple the second phase adjusted clock signal to the receiver circuit during the second read operation.

7. The memory controller of claim 6 wherein the memory controller further comprises a switch having inputs to receive the first phase adjusted clock signal and the second phase adjusted clock signal.

8. The memory controller of claim 6 further comprising a clock signal generator for supplying at least one clock signal to each phase adjustment circuit.

9. The memory controller of claim 6 wherein the first phase adjusted clock signal is used to time transferring of data by the receiver circuit during the first read operation and the second phase adjusted clock signal is used to time transferring of data by the receiver circuit during the second read operation.

10. The memory controller of claim 6, wherein the memory controller comprises:
- a cross-coupling circuit to selectively couple the first phase adjusted clock signal to the receiver circuit during the first read operation and to selectively couple the second phase adjusted clock signal to the receiver circuit instead of the first phase adjusted clock signal during the second read operation.

11. A memory controller for controlling memory devices organized in ranks, including a first rank and a second rank, the memory controller comprising:
- a transmitter circuit to transmit write data to the memory devices, wherein the transmitter circuit transmits write data to the first rank via a pad and transmits write data to the second rank via the pad;
- a first phase adjustment circuit for adjusting a phase of a clock signal to produce a first phase adjusted clock signal;
- a second phase adjustment circuit for adjusting a phase of a clock signal to produce a second phase adjusted clock signal; and
- wherein, during two consecutive first and second write operations involving first and second ranks, respectively, the memory controller is configured to couple the first phase adjusted clock signal to the transmitter circuit during the first write operation and to couple the second phase adjusted clock signal to the transmitter circuit during the second write operation.

12. The memory controller of claim 11, wherein the memory controller comprises:
- a cross-coupling circuit to selectively couple the first phase adjusted clock signal to the transmitter circuit during the first write operation and to selectively couple the second phase adjusted clock signal to the transmitter circuit instead of the first phase adjusted clock signal during the second write operation.

13. A method of operating a memory controller coupled via signal conductors to memory devices organized in ranks, including a first rank and a second rank, the method comprising:
- generating a first phase adjusted clock signal from at least one clock signal;
- generating a second phase adjusted clock signal from the at least one clock signal; and
- performing two consecutive first and second memory read accesses involving the first and second ranks, respectively, wherein, during the first memory read access, the memory controller receives data from a memory device in the first rank via a pad and one of the signal conductors according to the first phase adjusted clock signal and wherein, during the second memory read access, the memory controller receives data from a memory device in the second rank via the pad and the same one of the signal conductors according to the second phase adjusted clock signal.

14. The method of claim 13 further comprising between the first and second memory read accesses switching a cross coupler that couples the first and second phase adjusted clock signals to a receiver circuit coupled to one of the signal conductors.

15. The method of claim 14 wherein the cross coupler comprises a multiplexer having inputs to receive the first and second phase adjusted clock signals.

16. The method of claim 13 further comprising:
- supplying the at least one clock signal to phase adjustment circuits that generate the first and second phase adjusted clock signals.

* * * * *